(12) United States Patent
Chen et al.

(10) Patent No.: US 12,557,400 B2
(45) Date of Patent: Feb. 17, 2026

(54) ENCAPSULATION ADHESIVE FILM

(71) Applicant: HANGZHOU FIRST APPLIED MATERIAL CO., LTD., Zhejiang (CN)

(72) Inventors: Xiang Chen, Zhejiang (CN); Haiyun Wu, Zhejiang (CN)

(73) Assignee: HANGZHOU FIRST APPLIED MATERIAL CO., LTD., Zhejiang (CN)

(*) Notice: Subject to any disclaimer, the term of this patent is extended or adjusted under 35 U.S.C. 154(b) by 0 days.

(21) Appl. No.: 18/713,689

(22) PCT Filed: Jan. 26, 2022

(86) PCT No.: PCT/CN2022/073956
§ 371 (c)(1),
(2) Date: May 27, 2024

(87) PCT Pub. No.: WO2023/092857
PCT Pub. Date: Jun. 1, 2023

(65) Prior Publication Data
US 2025/0040259 A1    Jan. 30, 2025

(30) Foreign Application Priority Data
Nov. 26, 2021  (CN) .......................... 202111423885.2

(51) Int. Cl.
H10F 19/80        (2025.01)
(52) U.S. Cl.
CPC .................................... H10F 19/80 (2025.01)
(58) Field of Classification Search
CPC ....................................................... H10F 19/80
See application file for complete search history.

(56) References Cited

U.S. PATENT DOCUMENTS

2010/0209671 A1    8/2010  Kato
2015/0064831 A1*   3/2015  Furihata ................. H10F 71/00
                                                                 438/64

FOREIGN PATENT DOCUMENTS

CN        202039015 U    11/2011
CN        202282367 U    6/2012
(Continued)

OTHER PUBLICATIONS

Machine translation of CN-213534113-U, Qiao, Gang. (Year: 2021).*
(Continued)

*Primary Examiner* — Mayla Gonzalez Ramos
(74) *Attorney, Agent, or Firm* — The Sun IP Law (57) ABSTRACT

The present disclosure discloses an encapsulation adhesive film 100, comprising an adhesive film body and a surface pattern provided on at least one surface of the adhesive film body, and the surface pattern comprising a first pattern extending basically along a first direction and a second pattern extending basically along a second direction, the first direction intersecting the second direction at a predetermined angle α, the predetermined angle α being greater than 0° and less than 180°; the surface pattern comprising at least one of the first pattern and at least one of the second pattern. The surface pattern on the surface of the encapsulation adhesive film 100 effectively solves the technical problems in the prior art, achieving the enhancement of the adhesion of the encapsulation adhesive film 100 on the photovoltaic substrate, and reducing the displacement problem during the process of laying the photovoltaic modules.

17 Claims, 9 Drawing Sheets

(56) References Cited

FOREIGN PATENT DOCUMENTS

| | | | |
|---|---|---|---|
| CN | 202332895 U | | 7/2012 |
| CN | 210535679 U | | 5/2020 |
| CN | 111416008 A | | 7/2020 |
| CN | 212113732 U | | 12/2020 |
| CN | 213534113 U | * | 6/2021 |
| CN | 216413097 U | | 4/2022 |
| KR | 20210051870 A | | 5/2021 |
| WO | 2012025273 A2 | | 3/2012 |

OTHER PUBLICATIONS

The search report of counterpart EP application No. 22896961.4 issued on Jan. 27, 2025.
The first office action of counterpart CN application No. 202111423885.2 issued on Aug. 28, 2024.

* cited by examiner

ENCAPSULATION ADHESIVE FILM

CROSS-REFERENCE TO RELATED APPLICATION

This application is a continuation of PCT Application No. PCT/CN2022/073956, filed on Jan. 26, 2022, which claims the priority and benefit of Chinese Patent Application No. 202111423885.2, filed on Nov. 26, 2021. The entirety of the above-mentioned patent applications are hereby incorporated by reference herein and made a part of this specification.

TECHNICAL FIELD

The present disclosure relates to the field of photovoltaic encapsulation technology, and in particular to an encapsulation adhesive film.

BACKGROUND

In response to the national requirements of "peak carbon dioxide emissions" and "carbon neutrality", the need to use new energy to replace thermal power generation has become more urgent. And photovoltaic power generation, as a kind of green energy, is considered to be the ideal new energy to replace thermal power generation. In addition, photovoltaic modules are the core parts in the process of photovoltaic power generation.

The photovoltaic modules usually include photovoltaic cells and substrates on both sides of the photovoltaic cells, and the photovoltaic cells and the substrates are encapsulated by encapsulation adhesive film. The encapsulation adhesive film plays an important role in the encapsulating and subsequent using of the photovoltaic modules, and the encapsulation quality of the encapsulation adhesive film affects the operation life of the photovoltaic modules directly.

However, in the process of acting the technical solutions in the embodiments of the present disclosure, the inventors found that the above technology has at least the following technical problems:

In the prior art, the encapsulation adhesive film with random electro-engraved embossing pattern has poor adhesion on the substrates such as glass, the encapsulation adhesive film is prone to perform slip phenomenon during the speed-up process of the production line, and the encapsulation adhesive film also is prone to roll and slip with the grids on the multiple main grids cell, that cause the displacement problem in the process of laying the photovoltaic modules, and the problem of poor appearance, which is caused by displacement of the photovoltaic cells, stack of the photovoltaic cells, bubbles, and lack of adhesive, etc. after the lamination process.

SUMMARY

The embodiments of the present disclosure provide an encapsulation adhesive film, which solving the technical problem of displacement of the encapsulation adhesive film in the process of laying the photovoltaic modules in the prior art, and achieving the technical effect of improving the adhesion of the encapsulation adhesive film on a substrate such as glass in the process of laying, avoiding rolling and slipping of the encapsulation adhesive film with the grids on the multiple main grids cell, and guaranteeing the encapsulation yield rate of the photovoltaic modules.

The embodiments of the present disclosure provide an encapsulation adhesive film, comprising an adhesive film body, and the encapsulation adhesive film further comprising a surface pattern provided on at least one surface of the adhesive film body, and the surface pattern comprising:

a first pattern, extending along a first direction basically;

a second pattern, extending along a second direction basically;

the first direction intersecting the second direction at a predetermined angle, the predetermined angle being greater than 0° and less than 180°;

the surface pattern comprises at least one of the first pattern and at least one of the second pattern.

Further, the thickness of the adhesive film body is 0.3-2.0 mm, the length of the first pattern is 1-5 mm, the width of the first pattern is 0.05-3 mm, and the length of the second pattern is 1-5 mm, the width of the second pattern is 0.05-3 mm.

Further, the predetermined angle being greater than 0° and less than or equal to 90°, the length-to-width ratio of the first pattern is (1.5-100):1, and the length-to-width ratio of the second pattern is (1.5-100):1; the predetermined angle being greater than 90° and less than 180°, the length-to-width ratio of the first pattern is (1.5-10):1, and the length-to-width ratio of the second pattern is (1.5-10):1.

Further, the first pattern is contacted with the second pattern.

Further, an end of the first pattern is contacted with an end of the second pattern, the end of the first pattern is contacted with a midpoint of the second pattern or a midpoint of the first pattern is contacted with the midpoint of the second pattern.

Further, a "Γ"-shaped distribution, a "T"-shaped distribution or a "+"-shaped distribution is provided between the first pattern and the second pattern.

Further, adjacent pattern units are connected so that the surface pattern is in a cross network structure.

Further, the first pattern is separated from the second pattern.

Further, the first pattern and the second pattern are protrusions.

Further, at least one of the first pattern and the second pattern is an arc-shaped protrusion, and the maximum height of the arc-shaped protrusion is 0.05-1.5 mm.

Further, at least one of the first pattern and the second pattern is a plateau protrusion, and the height of the plateau protrusion is 0.05-1.5 mm.

The technical solution provided in the embodiments of the present disclosure has at least the following advantages:

The present disclosure by providing the surface pattern on the surface of the encapsulation adhesive film, solving the technical problem in the prior art effectively, achieving the enhancement of the adhesion of the encapsulation adhesive film on the photovoltaic substrate, avoiding rolling and slipping of the encapsulation adhesive film with the grids on the multiple main grids cell, and reducing the displacement problem during the process of laying the photovoltaic modules.

BRIEF DESCRIPTION OF THE DRAWINGS

The above-mentioned drawings include the following drawing markers: 100, encapsulation adhesive film; 101, first direction; 102, second direction; α, predetermined angle; H, thickness; L, height; a, length; b, width; 11, adhesive film body; 12, surface pattern; 121, first pattern; 122, second pattern.

DETAILED DESCRIPTION

In order to enable those skilled in the art to better understand the embodiments of the present disclosure, the technical solutions in the specific embodiments of the present disclosure will be clearly and completely described below in combination with the drawings in the embodiments of the present disclosure. It is to be noted that the embodiments and the features in the embodiments of the present disclosure may be combined with each other without conflict. The present disclosure will be described in detail below in combination with the embodiments.

The embodiments of the present disclosure by providing an encapsulation adhesive film 100, solving the problem of poor appearance of the photovoltaic modules after the laying process in the prior art, which is caused by poor adhesion between the encapsulation adhesive film and the photovoltaic substrates, avoiding rolling and slipping of the encapsulation adhesive film with the grids on the multiple main grids cell, and achieving the encapsulation adhesive film 100 does not perform displacement problem during the process of laying the photovoltaic modules by providing a surface pattern 12 on the surface of the encapsulation adhesive film 100.

Figure 1:
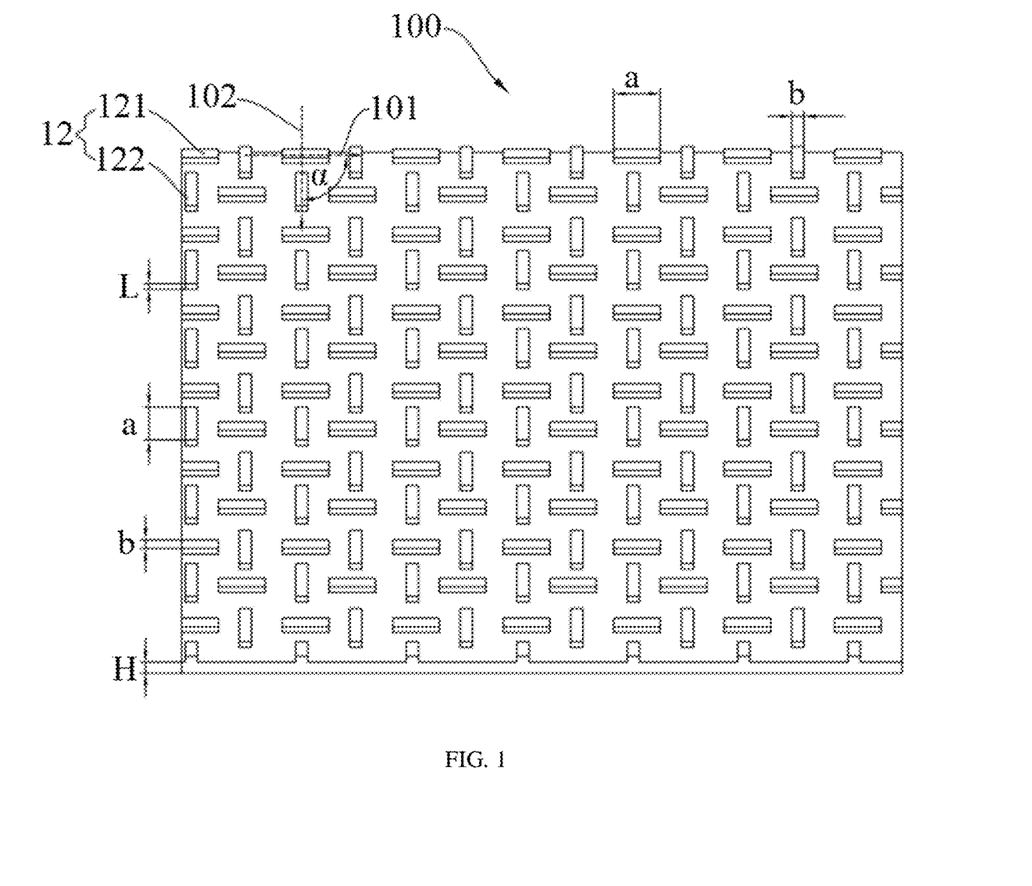
FIG. 1 is a schematic view of the encapsulation adhesive film according to an embodiment of the present disclosure.

The embodiments of the present disclosure provide an encapsulation adhesive film 100, and in particular to a photovoltaic encapsulation adhesive film. Referring to FIG. 1, the encapsulation adhesive film 100 includes an adhesive film body 11, and a surface pattern 12 provided on at least one surface of the adhesive film body 11, and the surface pattern 12 includes at least two same or different pattern units. The pattern unit specifically includes a first pattern 121 and a second pattern 122, the first pattern 121 basically extends along a first direction 101, and the second pattern 122 basically extends along a second direction 102. The first direction 101 intersects the second direction 102 at a predetermined angle α, the predetermined angle α is greater than 0° and less than 180°. The surface pattern 12 is provided on the surface of the encapsulation adhesive film 100, which can enhance the adhesion between the encapsulation adhesive film 100 and substrate during the process of laying the photovoltaic modules, and solve the displacement problem between the encapsulation adhesive film and the substrate which is easily caused by poor adhesion in the prior art. In addition, the surface pattern 12 also can enhance the peeling performance between the encapsulation adhesive film 100 and the mold after the molding process, ensure the integrity of the encapsulation adhesive film 100 after the peeling process, solve the problem of difficulty in peeling the encapsulation adhesive film after the molding process in the prior art. The surface pattern 12 includes at least one pattern unit formed by the first pattern 121 and the second pattern 122, the first pattern 121 and the second pattern 122 are basically in the form of stripes. The first pattern 121 basically extends along the first direction 101, and the second pattern 122 basically extends along the second direction 102. The first direction 101 intersects the second direction 102 at the predetermined angle α, and the predetermined angle α only needs to be ensured that the first direction 101 and the second direction 102 are not parallel or coincident with each other, and generally the first direction 101 and the second direction 102 are provided to be basically perpendicular under the circumstance of ensuring the technical effect.

As an embodiment, the thickness H of the adhesive film body 11 is 0.3-2.0 mm. The encapsulation adhesive film 100 is provided with a protrusion, and if the thickness H of the adhesive film body 11 still in accordance with the existing adhesive film which is not provided with the protrusion, it inevitably causes the adhesive content of the adhesive film being excessive, which not only increases the production cost, but also reduces the bonding ability after encapsulating process of the photovoltaic modules due to the excessive thickness of the adhesive layer and affects the operation life of the photovoltaic modules. In order to ensure that the adhesive content of the encapsulation film 100 satisfies the requirements for encapsulating of the photovoltaic modules, and it is necessary to adjust the thickness H of the adhesive film body 11 accordingly. As for the encapsulation film 100 with more the protrusions, it is necessary to reduce the thickness H of the adhesive film body 11 accordingly. In addition, according to the actual production requirements, it is also possible to set the thickness H of the adhesive film body 11. And the thickness H of the adhesive film body 11 in the range of 0.3-2.0 mm is a more appropriate range of the thickness H for this present disclosure, which not only satisfy the needs of the adhesive content of the encapsulation adhesive film 100, but also reduce the production cost and improve the production efficiency.

As an embodiment, the length a of the first pattern 121 is 1-5 mm, and the width b of the first pattern 121 is 0.05-3 mm; the length a of the second pattern 122 is 1-5 mm, and the width b of the second pattern 122 is 0.05-3 mm. In addition, the dimensions of the first pattern 121 and the second pattern 122 are limited to ensure that the first pattern 121 and the second pattern 122 have a certain length a and a width b, to ensure that the contact area between the encapsulation adhesive film 100 and the substrate can be enlarged, thus to ensure that the adhesion between the encapsulation adhesive film 100 and the substrate cam be enhanced during the laying process, and to ensure that there is no displacement or other problems occurred. The dimensions of the first pattern 121 and the second pattern 122 should not be too large. If the first pattern 121 and the second pattern 122 are too large, the quantity of the first pattern 121 and the second pattern 122 per unit area of the encapsulation adhesive film 100 became less, during the encapsulating process, the contact area between the encapsulation adhesive film 100 and the substrate became less, which reduced the adhesion of the encapsulation adhesive film 100 on the substrate, and caused the encapsulation adhesive film 100 to be more prone to slipping, a problem that still cannot be resolved. The dimensions of the first pattern 121 and the second pattern 122 should also not be too small. If the first pattern 121 and the second pattern 122 are too small, the quantity of the first pattern 121 and the second pattern 122 per unit area of the encapsulation adhesive film 100 became more, which increased the difficulty of peeling the encapsulation adhesive film 100 from adhesive film rollers, and generated adverse effects on the integrity of the encapsulation adhesive film 100.

As an embodiment, when the predetermined angle is greater than 0° and less than or equal to 90°, the length-to-width ratio of the first pattern is (1.5-100):1, and the length-to-width ratio of the second pattern is (1.5-100):1; and when the predetermined angle is greater than 90° and less than 180°, the length-to-width ratio of the first pattern is (1.5-10):1. And the length-to-width ratio of the second pattern is (1.5-10):1. When the angle between the first pattern and the second pattern is greater than 90°, the space occupied by the entire pattern unit formed by the first pattern and the second pattern is greater, and if the length-to-width ratio of the first pattern and the second pattern is still greater, it makes the pattern area per unit of adhesive film area occupy a smaller area, reduces the contact area between the encapsulation adhesive film and the substrate, reduces the adhesion between the encapsulation adhesive film and the substrate during the laying process, and occurs displacement or other problems easily. Therefore, in the case of a large angle between the first pattern and the second pattern, the length-to-width ratio of the first pattern or the second pattern is limited to a small range to ensure that the contact area between the encapsulation adhesive film and the substrate during the laying process, and to ensure the adhesion between the two.

As an embodiment, the first pattern 121 is contacted with the second pattern 122. When setting the first pattern 121 and the second pattern 122, the first pattern 121 and the second pattern 122 may contact with each other directly to form an intersection or an intersection point. When the first pattern 121 and the second pattern 122 are in contact with each other and form the intersection or the intersection point, the first pattern 121 and the second pattern 122 are in contacted with each other and support each other, increasing the structural stability of the first pattern 121 and the second pattern 122, so that the first pattern 121 and the second pattern 122 are less prone to occur displacement or other situations that tend to reduce the yield rate.

As an embodiment, an end of the first pattern 121 is contacted with an end of the second pattern 122, the end of the first pattern 121 is contacted with a midpoint of the second pattern 122 or a midpoint of the first pattern 121 is contacted with the midpoint of the second pattern 122. The specific case in which the first pattern 121 and the second pattern 122 are contacted may be that the end of the first pattern 121 is contacted with the end of the second pattern 122, or that the end of one of the first pattern 121 or the second pattern 122 is contacted with any position of the other patterns other than the endpoints, and also that any point of the first pattern 121 other than the endpoints is contacted with any point of the second pattern 122 other than the endpoints.

Figure 2:
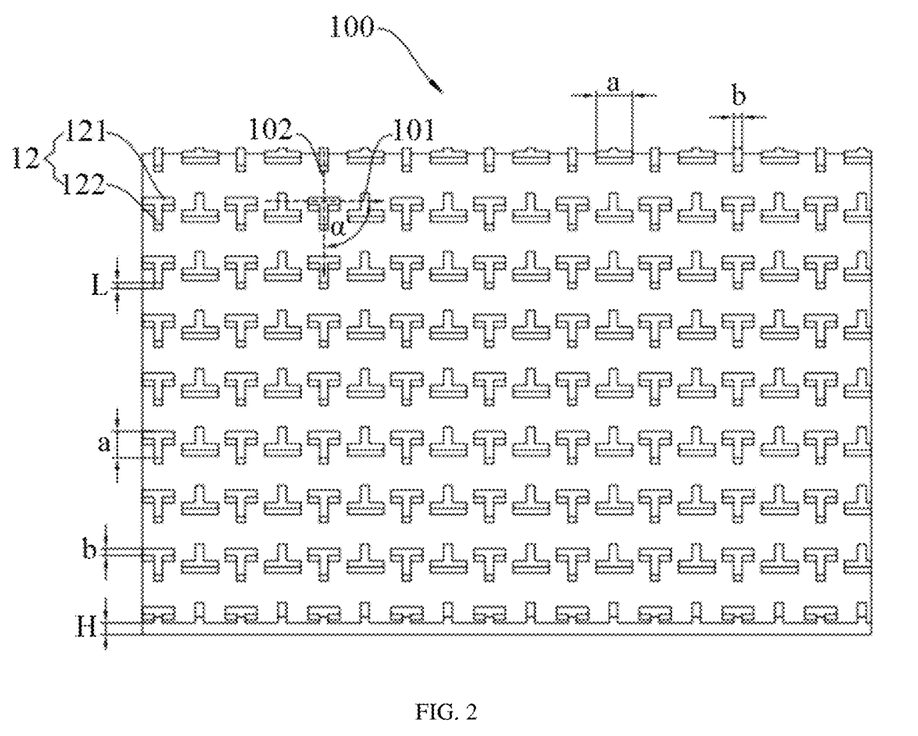
FIG. 2 is a schematic view of the encapsulation adhesive film according to another embodiment of the present disclosure.
Figure 3:
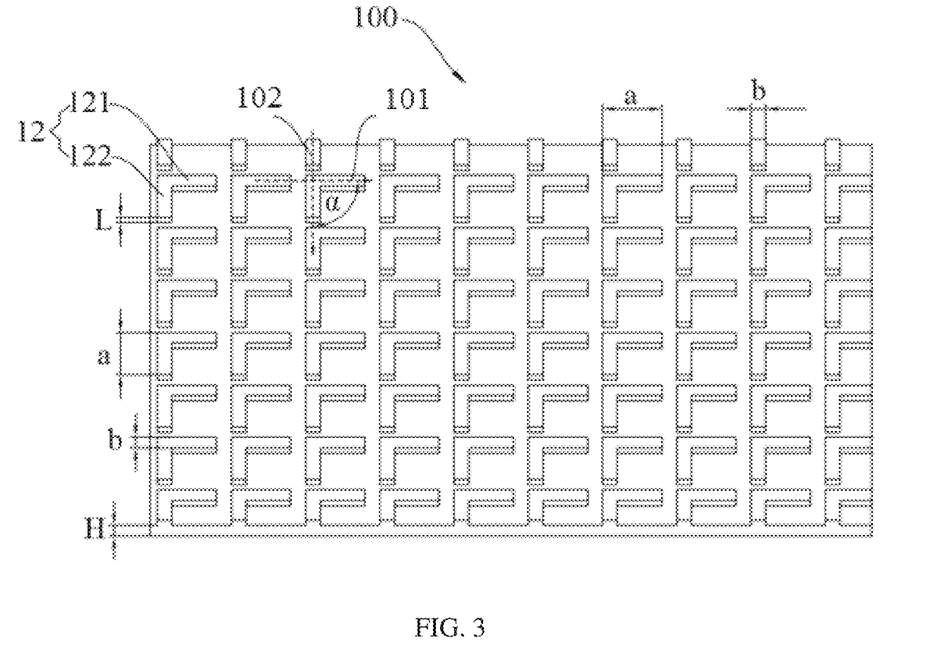
FIG. 3 is a schematic view of the encapsulation adhesive film according to another embodiment of the present disclosure.
Figure 4:
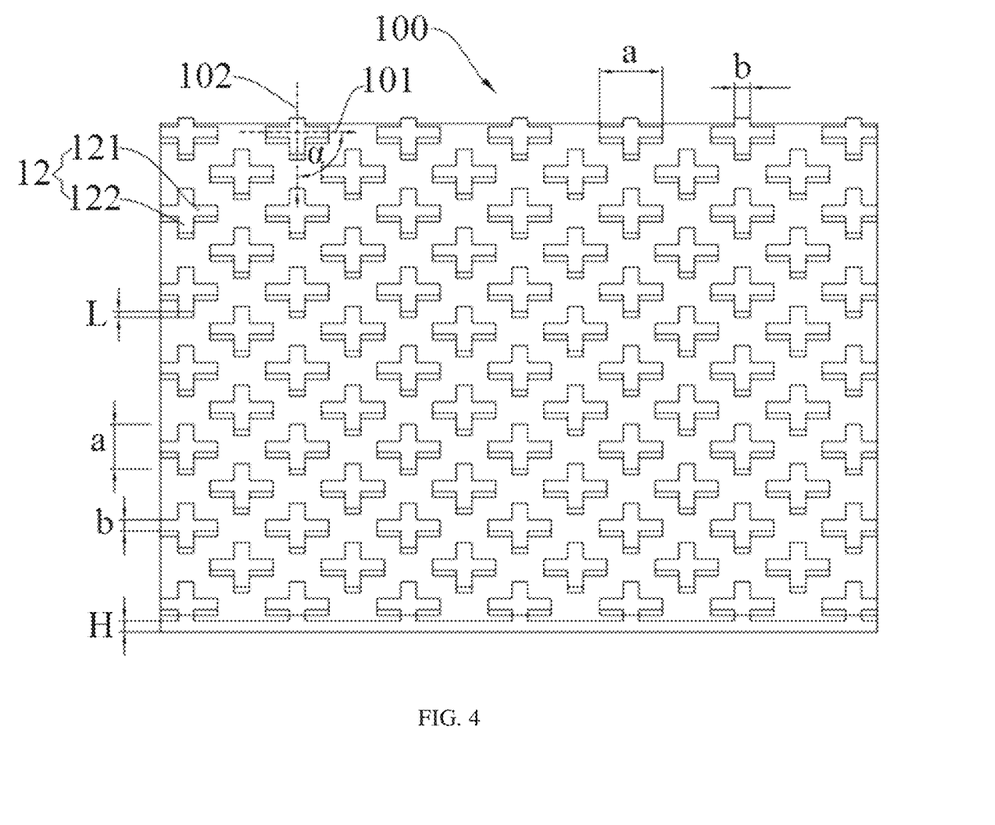
FIG. 4 is a schematic view of the encapsulation adhesive film according to another embodiment of the present disclosure.

As an embodiment, the first pattern 121 and the second pattern 122 are in contact with each other in a "T"-shaped distribution (as shown in FIG. 2), a "Γ"-shaped distribution (as shown in FIG. 3) or a "+"-shaped distribution (as shown in FIG. 4). For the sake of simplicity of mold design, the first pattern 121 and the second pattern 122 are in contact with each other and form an intersection or an intersection point in this embodiment. Specifically, the first pattern 121 and the second pattern 122 may arrange as follows, the end of the first pattern 121 and the end of the second pattern 122 are in contact with each other, or the end of the first pattern 121 and the midpoint of the second pattern 122 are in contact with each other, and also the midpoint of the first pattern 121 and the midpoint of the second pattern 122 are in contact with each other. The first pattern 121 and the second pattern 122 being provided with each other can enable the first pattern 121 and the second pattern 122 to support each other, ensuring the structural integrity of the first pattern 121 and the second pattern 122 during the production.

Figure 5:
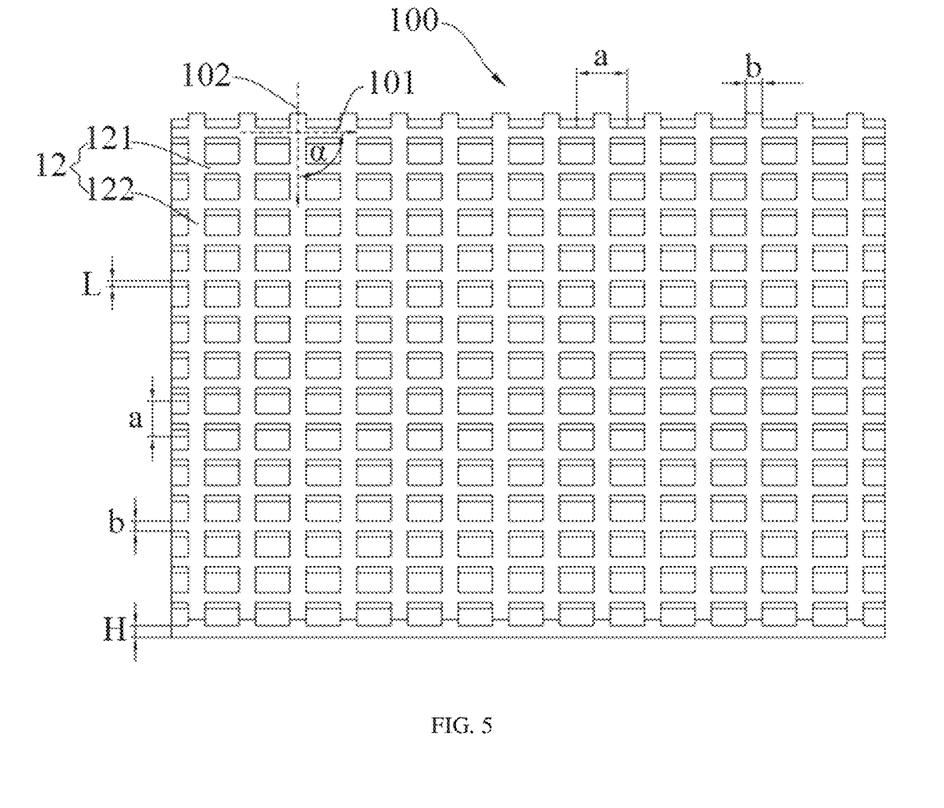
FIG. 5 is a schematic view of the encapsulation adhesive film according to another embodiment of the present disclosure.

As an embodiment, as shown in FIG. 5, adjacent pattern units are connected so that the surface pattern 12 is in a cross network structure. For the case where the first pattern 121 and the second pattern 122 are in contact with each other, the adjacent first patterns 121 may contact with each other by head to tail directly, and also the adjacent second patterns 122 may contact with each other by head to tail directly, forming the surface pattern 12 in a cross network structure ultimately.

As an embodiment, the first pattern 121 and the second 122 are separated from each other. And also the first pattern 121 and the second pattern 122 may be out of contact with each other, the first pattern 121 and the second pattern 122 in a separated state.

As an embodiment, the first pattern 121 and the second pattern 122 are protrusion. The encapsulation film 100 needs to be laminated with the substrate such as glass and other materials before the encapsulating process of the photovoltaic modules. In the prior art, the photovoltaic module is developed in the direction of large size, and also the encapsulation adhesive film and the substrate are developed in the direction of large size. In the actual laminating process of the encapsulation adhesive film and the substrate, all the sides of the encapsulation adhesive film are laminated with the substrate firstly, and a problem happens at this time is that after all the sides of the encapsulation adhesive film have laminated with the substrate, there is a large amount of air in some positions between the encapsulation adhesive film and the substrate that cannot be discharged in a timely method. In the existing technology, the air is discharged by suction, but due to the develop direction of the large-sized photovoltaic modules. If air is only discharged by suction, the exhaust efficiency is lower. And as the suction proceeds, the encapsulation film and the substrate are laminated continuously, so that the center and the other positions farther away from the air extraction device of the substrate will still be an amount of the air cannot be discharged completely. And there are the air bubbles between the encapsulation film and the substrate, and these air bubbles will affect the quality after the laminating process of the photovoltaic modules, and reduce the quality and operation life of the photovoltaic modules. The certain protruding structures are provided on the adhesive film body 11, and there are gaps between the protruding structures, and the gaps are able to provide an discharge channel for the air discharging between the encapsulation adhesive film 100 and the substrate in the laminating process, which can achieve the air discharging completely, ensure the laminating effect between the encapsulation adhesive film and the substrate, and reduce the slipping problem happening between the encapsulation adhesive film and the substrate.

Figure 6:
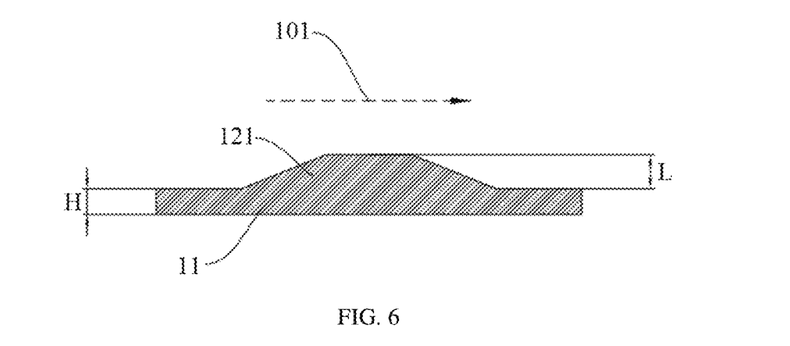
FIG. 6 is a schematic view of a longitudinal section of the first pattern according to an embodiment of the present disclosure.

As an embodiment, as shown in FIG. 6, at least one of the first pattern 121 or the second pattern 122 is a plateau protrusion, and the height L of the plateau protrusion is 0.2-1.5 mm.

Figure 7:
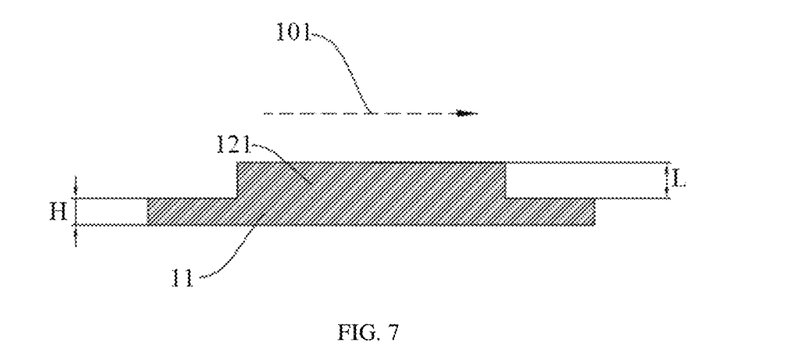
FIG. 7 is a schematic view of a longitudinal section of the first pattern according to another embodiment of the present disclosure.

As an embodiment, as shown in FIG. 7, at least one of the first pattern 121 or the second pattern 122 is a rectangular cuboid protrusion, and the height L of the rectangular cuboid protrusion is 0.2-1.5 mm.

Figure 8:
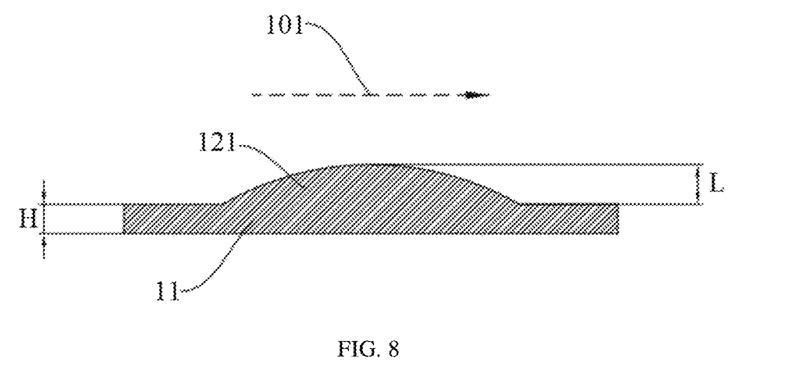
FIG. 8 is a schematic view of a longitudinal section of the first pattern according to another embodiment of the present disclosure.

As an embodiment, as shown in FIG. 8, at least one of the first pattern 121 or the second pattern 122 is an arc-shaped protrusion, and the maximum height L of the arc-shaped protrusion is 0.2-1.5 mm.

The top surfaces of the first pattern 121 and the second pattern 122 may be horizontal surfaces or curved surfaces with a certain curvature. The height L of the first pattern 121 and the second pattern 122 should not be too high, otherwise, due to the lack of adhesive in the pattern layer formed by the first pattern 121 and the second pattern 122, it will cause an excessive shortage of adhesive in the encapsulation adhesive film 100 as a whole. And it will affect the bonding ability of the encapsulation adhesive film 100 during the subsequent encapsulating process of the photovoltaic modules. The height L of the pattern 121 and the second pattern 122 is preferably not greater than the thickness H of the adhesive film body 11.

In order to better understand the above technical solution, the following will be combined with the drawings of the specification and the specific embodiments to provide a detailed description of the above technical solution.

Embodiment 1

As shown in FIG. 1, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "T"-shaped distribution was provided between the first pattern 121 and the second pattern 122 without contacting, the first pattern 121 was a curved bar-shaped protrusion in the longitudinal section along the first direction 101 (as shown in FIG. 7), the second pattern 122 was a curved bar-shaped protrusion which is the same as the first pattern 121 in the longitudinal section along the second direction 102. The thickness H of the adhesive film body 11 was 0.3 mm, the length a of the first pattern 121 was 1.0 mm, the width b of the first pattern 121 was 0.05 mm, and the height L of the first pattern 121 was 0.05 mm. And the length a of the second pattern 122 was 1.0 mm, the width b of the second pattern 122 was 0.05 mm, and the height L of the second pattern 122 was 0.05 mm.

Embodiment 2

As shown in FIG. 2, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "T"-shaped distribution was provided between the first pattern 121 and the second pattern 122 with contacting, the first pattern 121 was a curved bar-shaped protrusion in the longitudinal section along the first direction 101 (as shown in FIG. 7), the second pattern 122 was a curved bar-shaped protrusion which is the same as the first pattern 121 in the longitudinal section along the second direction 102. The thickness H of the adhesive film body 11 was 1.0 mm, the length a of the first pattern 121 was 5.0 mm, the width b of the first pattern 121 was 3.0 mm, and the height L of the first pattern 121 was 1.5 mm. And the length a of the second pattern 122 was 5.0 mm, the width b of the second pattern 122 was 3.0 mm, and the height L of the second pattern 122 was 1.5 mm.

Embodiment 3

As shown in FIG. 3, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "「"-shaped distribution was provided between the first pattern 121 and the second pattern 122 with contacting, the first pattern 121 was a curved bar-shaped protrusion in the longitudinal section along the first direction 101 (as shown in FIG. 7), the second pattern 122 was a curved bar-shaped protrusion which is the same as the first pattern 121 in the longitudinal section along the second direction 102. The thickness H of the adhesive film body 11 was 1.5 mm, the length a of the first pattern 121 was 2.0 mm, the width b of the first pattern 121 was 0.1 mm, and the height L of the first pattern 121 was 0.1 mm. And the length a of the second pattern 122 was 2.0 mm, the width b of the second pattern 122 was 0.1 mm, and the height L of the second pattern 122 was 0.1 mm.

Embodiment 4

As shown in FIG. 4, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "+"-shaped distribution was provided between the first pattern 121 and the second pattern 122 with contacting, the first pattern 121 was a curved bar-shaped protrusion in the longitudinal section along the first direction 101 (as shown in FIG. 7), the second pattern 122 was a curved bar-shaped protrusion which is the same as the first pattern 121 in the longitudinal section along the second direction 102. The thickness H of the adhesive film body 11 was 2.0 mm, the length a of the first pattern 121 was 3.0 mm, the width b of the first pattern 121 was 0.5 mm, and the height L of the first pattern 121 was 0.4 mm. And the length a of the second pattern 122 was 3.0 mm, the width b of the second pattern 122 was 0.5 mm, and the height L of the second pattern 122 was 0.4 mm.

Embodiment 5

As shown in FIG. 5, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "+"-shaped distribution was provided between the first pattern 121 and the second pattern 122 with contacting, the first pattern 121 was a rectangular bar-shaped protrusion in the longitudinal section along the first direction 101 (as shown in FIG. 7), the second pattern 122 was a rectangular bar-shaped protrusion which is the same as the first pattern 121 in the longitudinal section along the second direction 102. And the adjacent pattern units were connected so that the surface pattern 12 was in a cross network structure. The thickness H of the adhesive film body 11 was 2.0 mm, the length a of the first pattern 121 was 4.0 mm, the width b of the first pattern 121 was 2.5 mm, and the height L of the first pattern 121 was 1.5 mm. And the length a of the second pattern 122 was 4.0 mm, the width b of the second pattern 122 was 2.5 mm, and the height L of the second pattern 122 was 1.5 mm.

Embodiment 6

Figure 9:
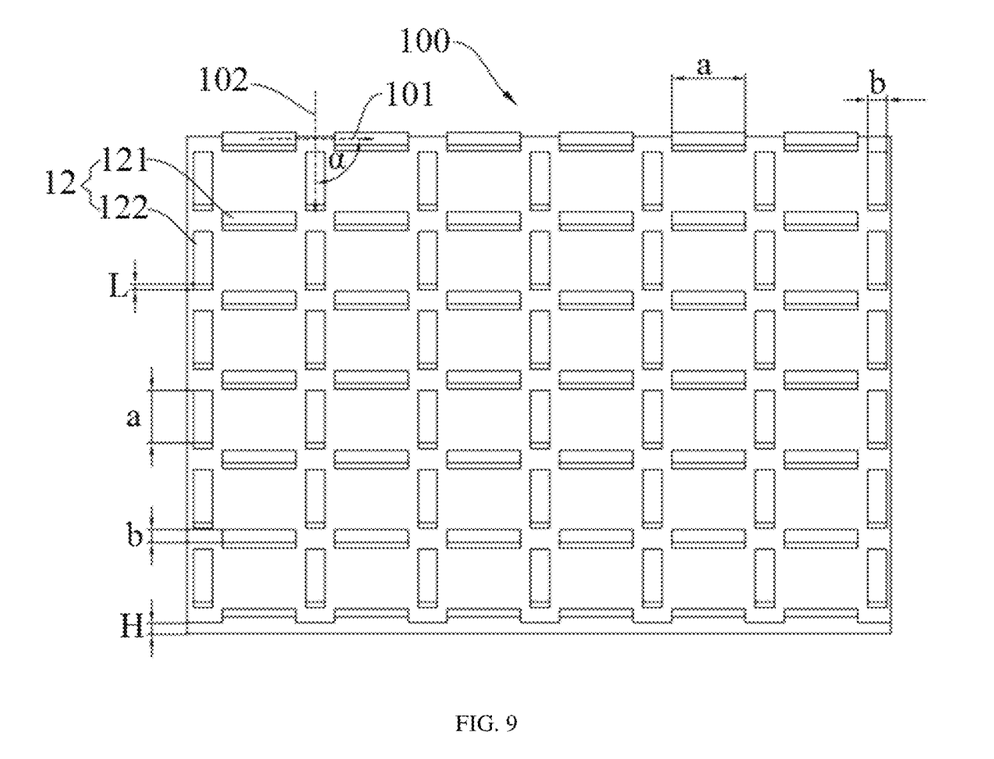
FIG. 9 is a schematic view of the encapsulation adhesive film according to another embodiment of the present disclosure.

As shown in FIG. 9, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, the first direction 101 and the second direction 102 been perpendicular to each other, and the angle between the first direction 101 and the second direction 102 was a predetermined angle α, the predetermined angle α been 90°. A similar "Γ"-shaped distribution was provided between the first pattern 121 and the second pattern 122 without contacting, the first pattern 121 was a trapezoidal bar-shaped protrusion in the longitudinal section along the first direction 101 (as shown in FIG. 7), the second pattern 122 was a trapezoidal bar-shaped protrusion which is the same as the first pattern 121 in the longitudinal section along the second direction 102. The thickness H of the adhesive film body 11 was 1.5 mm, the length a of the first pattern 121 was 3.0 mm, the width b of the first pattern 121 was 2.0 mm, and the height L of the first pattern 121 was 1.0 mm. And the length a of the second pattern 122 was 3.0 mm, the width b of the second pattern 122 was 2.0 mm, and the height L of the second pattern 122 was 1.0 mm.

Embodiment 7

Figure 10:
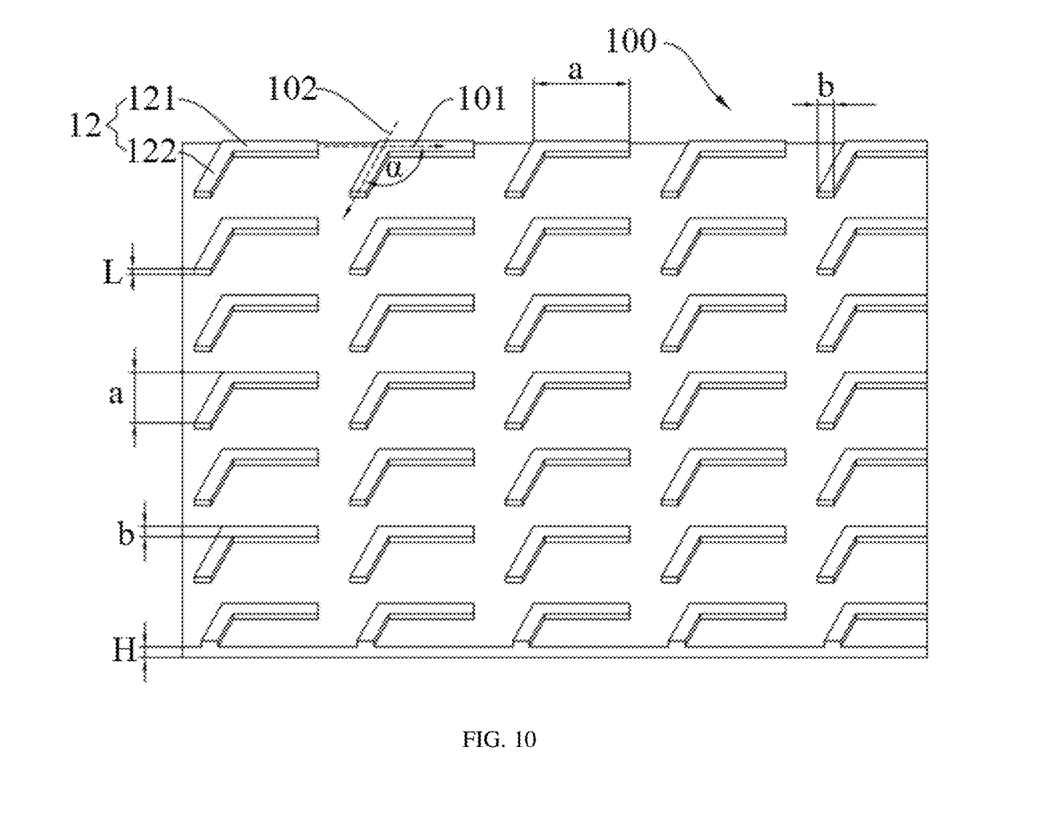
FIG. 10 is a schematic view of the encapsulation adhesive film according to another embodiment of the present disclosure.

As shown in FIG. 10, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, and the angle between the first direction 101 and the second direction 102 was a predetermined angle α, the predetermined angle α been 135°. An end of the first pattern 121 was contacted with an end of the second pattern 122, the first pattern 121 was a curved bar-shaped protrusion in the longitudinal section along the first direction 101 (as shown in FIG. 7), the second pattern 122 was a curved bar-shaped protrusion which is the same as the first pattern 121 in the longitudinal section along the second direction 102. The thickness H of the adhesive film body 11 was 1.5 mm, the length a of the first pattern 121 was 3.0 mm, the width b of the first pattern 121 was 1.5 mm, and the height L of the first pattern 121 was 0.8 mm. And the length a of the second pattern 122 was 3.0 mm, the width b of the second pattern 122 was 1.5 mm, and the height L of the second pattern 122 was 0.8 mm.

Embodiment 8

Figure 11:
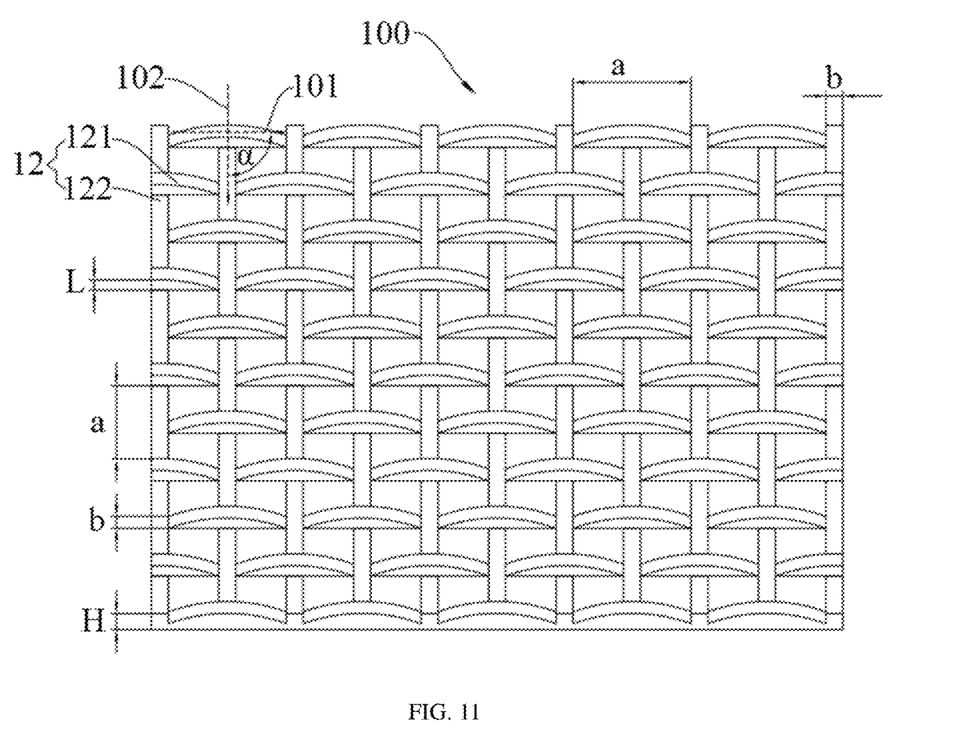
FIG. 11 is a schematic view of the encapsulation adhesive film according to another embodiment of the present disclosure.

As shown in FIG. 11, an encapsulation adhesive film 100 included an adhesive film body 11, and a surface pattern 12 was provided on one surface of the adhesive film body 11, the surface pattern 12 and the adhesive film body 11 were molded integrally. The surface pattern 12 included a pattern unit formed by a first pattern 121 and a second pattern 122, the first pattern 121 extended along a first direction 101, the second pattern 122 extended along a second direction 102, and the angle between the first direction 101 and the second direction 102 was a predetermined angle α, the predetermined angle α been 135°. An end of the first pattern 121 was contacted with an end of the second pattern 122, the first pattern 121 was a curved bar-shaped protrusion in the longitudinal section along the first direction 101 (as shown in FIG. 8), the second pattern 122 was a curved bar-shaped protrusion which is the same as the first pattern 121 in the longitudinal section along the second direction 102. The first pattern and the second pattern cooperated to from a structure similar to the warp and weft weaving of fibers. The thickness H of the adhesive film body 11 was 1.5 mm, the length a of the first pattern 121 was 3.0 mm, the width b of the first pattern 121 was 1.5 mm, and the maximum height L of the first pattern 121 was 0.8 mm. And the length a of the second pattern 122 was 3.0 mm, the width b of the second pattern 122 was 1.5 mm, and the maximum height L of the second pattern 122 was 0.8 mm.

The encapsulation adhesive film prepared in Embodiments 1 to 8 during the laminating process of the photovoltaic modules, observed no problems of slipping of the encapsulation adhesive film or displacement of the cell.

It should be understood that for those skilled in the art, the modifications and the variations may be performed according to the above description. Therefore, all the modifications and the variations should be covered within the protection scope of the claims of the present disclosure.

What is claimed is:

1. An encapsulation adhesive film comprising an adhesive film body, wherein the encapsulation adhesive film further comprises:
   a surface pattern provided on at least one surface of the adhesive film body, and the surface pattern comprises:
   a first pattern, extending along a first direction;
   a second pattern, extending along a second direction;
   the first direction intersecting the second direction at a predetermined angle, the predetermined angle being greater than 0° and less than 180°;
   the surface pattern comprises at least one of the first pattern and at least one of the second pattern; wherein
   when the predetermined angle is greater than 0° and less than or equal to 90°, the length-to-width ratio of the first pattern is (1.5-100):1, and the length-to-width ratio of the second pattern is (1.5-100):1; or
   when the predetermined angle is greater than 90° and less than 180°, the length-to-width ratio of the first pattern is (1.5-10):1, and the length-to-width ratio of the second pattern is (1.5-10):1; and
   the first pattern and the second pattern are protrusions.

2. The encapsulation adhesive film according to claim 1, wherein the thickness of the adhesive film body is 0.3-2.0 mm, the length of the first pattern is 1-5 mm, the width of the first pattern is 0.05-3 mm, the length of the second pattern is 1-5 mm, and the width of the second pattern is 0.05-3 mm.

3. The encapsulation adhesive film according to claim 1, wherein the first pattern is contacted with the second pattern.

4. The encapsulation adhesive film according to claim 3, wherein an end of the first pattern is contacted with an end of the second pattern, the end of the first pattern is contacted with a midpoint of the second pattern or a midpoint of the first pattern is contacted with the midpoint of the second pattern.

5. The encapsulation adhesive film according to claim 4, wherein a "Γ"-shaped distribution, a "T"-shaped distribution or a "+"-shaped distribution is provided between the first pattern and the second pattern.

6. The encapsulation adhesive film according to claim 3, wherein a pattern unit includes the first pattern and the second pattern, and adjacent pattern units are connected so that the surface pattern is in a cross network structure.

7. The encapsulation adhesive film according to claim 1, wherein the first pattern is separated from the second pattern.

8. The encapsulation adhesive film according to claim 1, wherein at least one of the first pattern and the second pattern is an arc-shaped protrusion, and the maximum height of the arc-shaped protrusion is 0.05-1.5 mm.

9. The encapsulation adhesive film according to claim 1, wherein at least one of the first pattern and the second pattern is a plateau protrusion, and the height of the plateau protrusion is 0.05-1.5 mm.

10. The encapsulation adhesive film according to claim 6, wherein the surface pattern includes at least two identical or distinct pattern units.

11. The encapsulation adhesive film according to claim 3, wherein, when setting the first pattern and the second pattern, the first pattern and the second pattern come into direct contact with each other, forming an intersection or intersection point.

12. The encapsulation adhesive film according to claim 3, wherein the first pattern is in contact with the second pattern, the surface pattern comprises at least two first patterns and at least two second patterns, the adjacent first patterns come into direct contact with each other by connecting head to tail, and/or the adjacent second patterns come into direct contact with each other by connecting head to tail.

13. The encapsulation adhesive film according to claim 8, wherein the maximum height of the arc-shaped protrusion is 0.2-1.5 mm.

14. The encapsulation adhesive film according to claim 9, wherein the height of the plateau protrusion is 0.2-1.5 mm.

15. The encapsulation adhesive film according to claim 1, wherein at least one of the first pattern and the second pattern is a rectangular cuboid protrusion, and the height L of the rectangular cuboid protrusion is 0.2-1.5 mm.

16. The encapsulation adhesive film according to claim 1, wherein the upper surfaces of both the first pattern and the second pattern are either horizontal or possess a curvature.

17. The encapsulation adhesive film according to claim 1, wherein the height L of the first pattern and the second pattern is not greater than the thickness H of the adhesive film body.

* * * * *